United States Patent
Roucka et al.

(10) Patent No.: US 8,889,978 B2
(45) Date of Patent: *Nov. 18, 2014

(54) III-V SEMICONDUCTOR INTERFACE WITH GRADED GESN ON SILICON

(75) Inventors: Radek Roucka, Mountain View, CA (US); Michael Lebby, Apache Junction, AZ (US); Scott Semans, Sunnyvale, CA (US)

(73) Assignee: Translucent, Inc., Palo Alto, CA (US)

( * ) Notice: Subject to any disclaimer, the term of this patent is extended or adjusted under 35 U.S.C. 154(b) by 148 days.

This patent is subject to a terminal disclaimer.

(21) Appl. No.: 13/619,605

(22) Filed: Sep. 14, 2012

(65) Prior Publication Data

US 2014/0076390 A1    Mar. 20, 2014

(51) Int. Cl.
*H01L 31/18* (2006.01)
(52) U.S. Cl.
USPC .............................. 136/255; 136/252; 438/87
(58) Field of Classification Search
USPC ...................................... 136/255, 252; 438/87
See application file for complete search history.

(56) References Cited

U.S. PATENT DOCUMENTS

| | | | | |
|---|---|---|---|---|
| 6,037,614 A * | 3/2000 | He et al. | .......................... | 257/184 |
| 6,153,013 A * | 11/2000 | Sakai et al. | .................... | 118/719 |
| 2005/0167709 A1 * | 8/2005 | Augusto | ........................ | 257/292 |
| 2011/0284074 A1 * | 11/2011 | Liu et al. | ........................ | 136/258 |
| 2011/0316043 A1 * | 12/2011 | Kouvetakis et al. | ........... | 257/183 |
| 2012/0085399 A1 * | 4/2012 | Lebby et al. | .................. | 136/255 |
| 2012/0090672 A1 * | 4/2012 | Lebby et al. | .................. | 136/255 |

* cited by examiner

*Primary Examiner* — Golam Mowla

(74) *Attorney, Agent, or Firm* — Parsons & Goltry; Robert A. Parsons; Michael W. Goltry (57) ABSTRACT

A method of depositing III-V solar collection materials on a GeSn template on a silicon substrate including the steps of providing a crystalline silicon substrate and epitaxially growing a single crystal GeSn layer on the silicon substrate using a grading profile to grade Sn through the layer. The single crystal GeSn layer has a thickness in a range of approximately 3 μm to approximately 5 μm. A layer of III-V solar collection material is epitaxially grown on the graded single crystal GeSn layer. The graded single crystal GeSn layer includes Sn up to an interface with the layer of III-V solar collection material.

8 Claims, 8 Drawing Sheets

RANGE OF ADDITIONAL SOLAR IRRADIATION
ABSORBED BY GeSn.

III-V SEMICONDUCTOR INTERFACE WITH GRADED GESN ON SILICON

FIELD OF THE INVENTION

This invention relates in general to the deposition of III-V semiconductor material on GeSn on silicon wafers and more specifically to the interface between the III-V material and the GeSn.

BACKGROUND OF THE INVENTION

In the solar cell industry, it is known that germanium (Ge) is a desirable semiconductor material that absorbs substantial amounts of solar energy. Commercially, 3 junctions using III-V materials are deployed on a germanium substrate to emulate or match the solar spectrum. In these devices the higher energy of the solar spectrum (e.g. blue light) is absorbed by the high bandgap materials, such as GaAs, InGaP and InGaAs. There are major problems with the use of germanium wafers. Germanium wafers are expensive and constitute approximately 50% of the total cost of the device. Also, germanium wafers are heavy and very brittle so that they are generally limited in size to less than 6" in diameter. Further, because the wafers are brittle they must be relatively thick which due to the thermal conductivity issue creates a cooling problem.

Presently, it has been found that the addition of tin (Sn) to germanium extends the absorption spectrum of a solar cell into lower energy light. Some efforts have been made in the prior art to grow GeSn incorporating a constant mole fraction of Sn on silicon substrates but the thickness of the layers is limited because of cracking and stress fractures. Because of the poor quality GeSn, efforts to grow IV and III-V materials used in solar cells has resulted in poor interfaces between materials and poor quality IV and III-V materials. As an example, a description of one such prior art method can be found in U.S. Pat. No. 7,589,003, entitled "GESN Alloys and Ordered Phases with Direct Tunable Bandgaps Grown Directly on Silicon", issued Sep. 15, 2009.

Because of the poor quality GeSn, efforts to grow IV and III-V materials used in solar cells has resulted in poor interfaces between materials and poor quality IV and III-V materials. Generally the poor interfaces and the poor crystalline quality of the solar cells that are formed results in substantially reduced efficiency and lower solar collection.

It would be highly advantageous, therefore, to remedy the foregoing and other deficiencies inherent in the prior art.

Accordingly, it is an object of the present invention to provide new and improved methods for the growth of single crystal III-V solar collection materials on single crystal GeSn on silicon substrates.

It is another object of the present invention to provide new and improved methods of growing III-V solar collection materials on GeSn with improved interfaces between materials.

It is another object of the present invention to provide new and improved solar cells with increased efficiency.

It is another object of the present invention to provide new and improved solar cells that are less costly and easier to produce.

SUMMARY OF THE INVENTION

Briefly, the desired objects and aspects of the instant invention are achieved in accordance with a preferred method of depositing III-V solar collection materials on a GeSn template on a silicon substrate. The method includes the steps of providing a crystalline silicon substrate and epitaxially growing a single crystal GeSn layer on the silicon substrate using a grading profile to grade Sn through the layer. The single crystal GeSn layer has a thickness in a range of approximately 3 µm to approximately 5 µm. A layer of III-V solar collection material is epitaxially grown on the graded single crystal GeSn layer. The graded single crystal GeSn layer includes Sn up to an interface with the layer of III-V solar collection material to substantially improve the interface between the GeSn layer and the layer of III-V solar collection material.

The desired objects and aspects of the instant invention are also realized in accordance with a specific method of fabricating a solar cell on a silicon substrate. The method includes the steps of providing a crystalline silicon substrate and epitaxially growing a graded template on the silicon substrate including a using a grading profile to grade Sn through the layer, the single crystal GeSn layer having a thickness in a range of approximately 3 µm to approximately 5 µm. A single crystal layer of Ge is epitaxially grown on the graded single crystal GeSn layer and a single crystal layer of GeSn is epitaxially grown on the graded single crystal Ge layer. A layer of single crystal III-V solar collection material is epitaxially grown on the single crystal GeSn layer.

The desired objects and aspects of the instant invention are also realized in accordance with a specific embodiment of III-V solar collection material grown on a GeSn template. The embodiment includes a crystalline silicon substrate with a graded single crystal GeSn layer epitaxially grown on the silicon substrate. The Sn is graded through the layer, and the single crystal GeSn layer has a thickness in a range of approximately 3 µm to approximately 5 µm. A layer of III-V solar collection material is epitaxially grown on the graded single crystal GeSn layer. The graded single crystal GeSn layer includes Sn up to an interface with the layer of III-V solar collection material.

The desired objects and aspects of the instant invention are also realized in accordance with a specific embodiment of a solar collection device on a silicon substrate. The device includes a crystalline silicon substrate with a graded single crystal GeSn layer epitaxially grown on the silicon substrate, the Sn being graded through the layer, and the graded single crystal GeSn layer having a thickness in a range of approximately 3 µm to approximately 5 µm. The device further includes a single crystal Ge layer epitaxially grown on the graded single crystal GeSn layer, a single crystal GeSn layer epitaxially grown on the single crystal Ge layer, and a layer of III-V solar collection material epitaxially grown on the single crystal GeSn layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
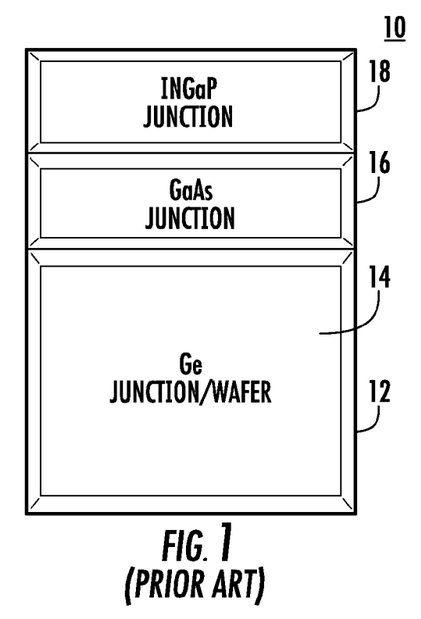
FIG. 1 illustrates a simplified layer diagram of a prior art solar cell on a germanium substrate.

Turning to FIG. 1, a simplified layer diagram is illustrated of a prior art solar cell 10 on a germanium substrate 12. A Ge solar junction 14 is formed on a p-type Ge substrate 12 via diffusion of n-type dopant (typically As) during fabrication process of overlying layers (16 and 18). A layer 16 of GaAs is epitaxially deposited on germanium layer 14 and a layer 18 of InGaP is epitaxially deposited on layer 16 to complete cell 10. Layers 16 and 18 are higher band gap materials that are included to absorb the higher energy light, such as blue light.

As explained above, germanium wafers are expensive and constitute approximately 50% of the total cost of solar cell 10. Also, germanium wafers are heavy and very brittle so that they are generally limited in size to less than 6" in diameter so that fewer cells can be formed from each wafer (if the wafer is cut into rectangular cells) or a smaller wafer (i.e. <6") is produced. Thus, because of the smaller wafer/cell the cost of labor is increased. Further, because the wafers are brittle they must be relatively thick which due to the thermal conductivity issue creates a cooling problem.

Figure 2:
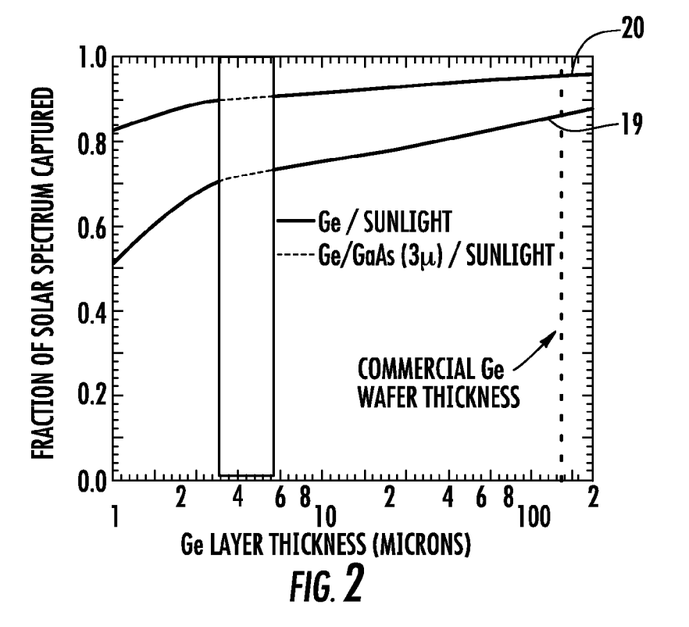
FIG. 2 is a graph illustrating the solar absorption of germanium relative to the thickness of the germanium.

Turning to FIG. 2, the graph illustrates the solar absorption of germanium relative to the thickness of the germanium. The lower curve, designated 19, illustrates the absorption of a germanium layer and the upper curve, designated 20, illustrates the absorption of a germanium layer with additional higher energy layers added. As illustrated in the graph, the germanium in either device provides substantially the maximum absorption between the thickness of 3 to 5 microns. Thus, when a germanium containing layer is included in a solar cell it is desirable to grow the layer to a thickness in the range of 3-5 microns for the maximum absorption and minimum effort and use of material. Here it should be noted that in the prior art devices and methods, layers of germanium and/or GeSn of this thickness have been difficult to achieve on other than germanium substrates.

Figure 3:
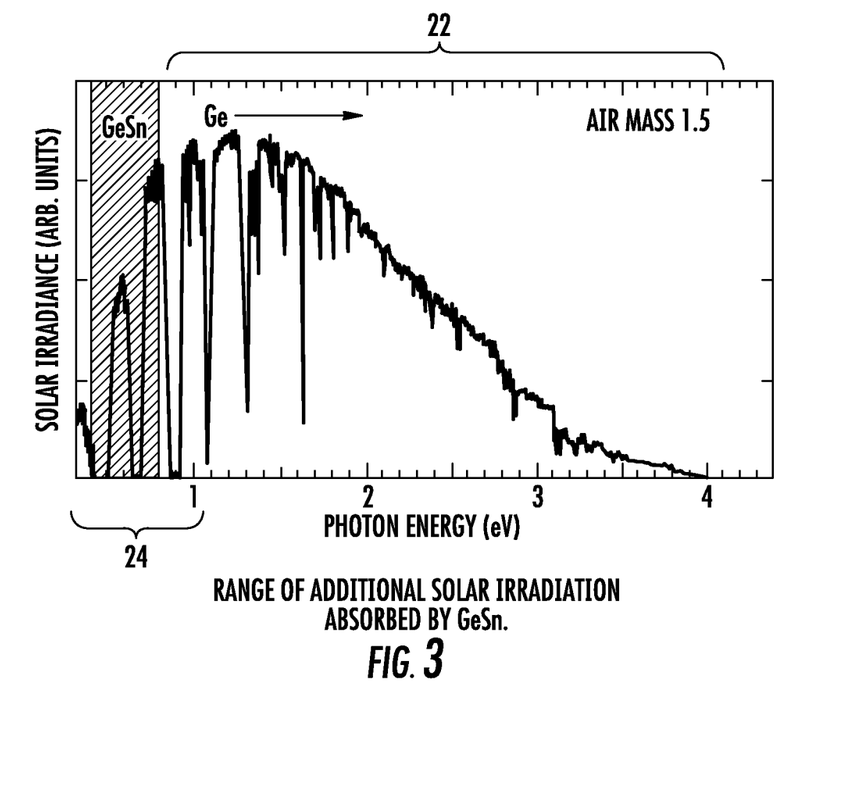
FIG. 3 is a representation of the solar spectrum illustrating the absorption areas of germanium and GeSn.

Referring additionally to FIG. 3, a representation of the solar spectrum is illustrated including the absorption areas of germanium, designated 22, and GeSn, designated 24. From this representation it can be seen that a shift of the lower absorption edge is obtained by including tin (Sn) In the solar cell material. It has been found that including approximately 2% tin with the germanium extends the detection range beyond the range of germanium by itself into the IR spectrum.

Figure 4:
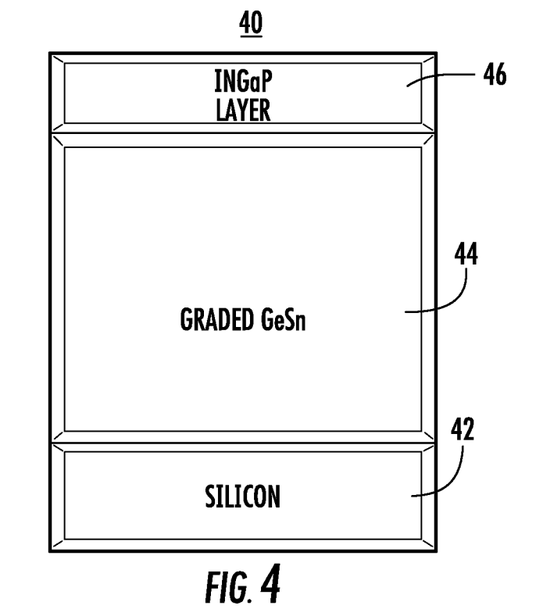
FIG. 4 is a simplified layer diagram of III-V solar collection material grown on a GeSn template on a silicon substrate in accordance with the present invention.

Referring specifically to FIG. 4, a simplified layer diagram is illustrated of a solar collection cell 40 including a crystalline silicon substrate 42 having a graded GeSn template 44 epitaxially grown thereon. A III-V solar collection material 46 is epitaxially grown on GeSn template 44 in accordance with the present invention. In this specific example, GeSn template 44 is a single layer approximately 5 μm thick. As established in conjunction with FIG. 2 above, it is highly desirable to grow the Ge or GeSn layers that will be absorbing solar energy with a thickness in a range of 3 μm to 5 μm to provide the maximum absorption or solar collection with the smallest amount of material. The problem in the prior art has been that attempts to grow GeSn layers on silicon wafers, using a constant Sn mole fraction, to a thickness in this range has resulted in substantial cracking and very poor crystalline quality.

In the example illustrated in FIG. 4 this problem has been solved by grading or varying the incorporation of the Sn into the Ge to form the graded GeSn template 44. A wide variety of grading profiles may be used to deposit the desired amount of GeSn and to achieve the thickness required. Grading consists of increasing the tin content from an initial point at or near zero to maximum in a mid-area and reducing the content to zero at or before the final area is reached. Referring additionally to FIGS. 6-10, examples of five different profiles that can be used to achieve the desired results are illustrated. From the different profiles it can be seen that the tin can be started at zero with the germanium or at some value, such as 0.3%. Further, the percentage of tin varies throughout the deposition generally reducing or tapering off from a maximum mid-area as the growth progresses. Each of these specific profiles has resulted in a desired template thickness of between approximately 3 μm and approximately 5 μm and the desired mix of germanium and tin. Further, because of the grading the desired thickness in the resulting layer can be achieved with higher crystalline quality and substantial elimination of cracking.

Another major problem that occurs in the prior art is that the cracking and poor crystalline quality results in interfaces between materials that include cracking and poor crystalline matching. It will be understood that multi-junction solar cells are generally positioned so that solar energy pass through the various materials and the interfaces between the materials. If the interfaces are cracked and include poor crystalline quality material absorption of the solar energy can be substantially reduced.

To overcome this problem the grading procedure is carried up to the interface with the subsequent epitaxial growth. As can be seen in any of the profiles illustrated in FIGS. 6-10, the grading profile extends up to the interface with the III-V material, in this specific example InGaP, and the amount of Sn in the material remains at some value above zero when the interface is reached. Generally, the template and III-V layer or layers are grown in a machine in what is considered a continuous or in situ process. By growing the Graded GeSn template with Sn included directly up to the III-V material, the interface between the two materials is substantially improved and the crystalline quality of the interface (along with the materials on both sides of the interface) is substantially improved. Either the GeSn target composition is chosen to match the III-V layers or the composition of the III-V layers can be adjusted to match GeSn, when the GeSn bandgap is important. Thus, as illustrated in FIGS. 6-10 a 5 um thick template of GeSn layer can be grown and a 2 um layer of III-V material (InGaP or the like) can be grown with a high quality interface therebetween. It should be noted that the Sn softens the interface and helps to alleviate interface strains.

Figure 5:
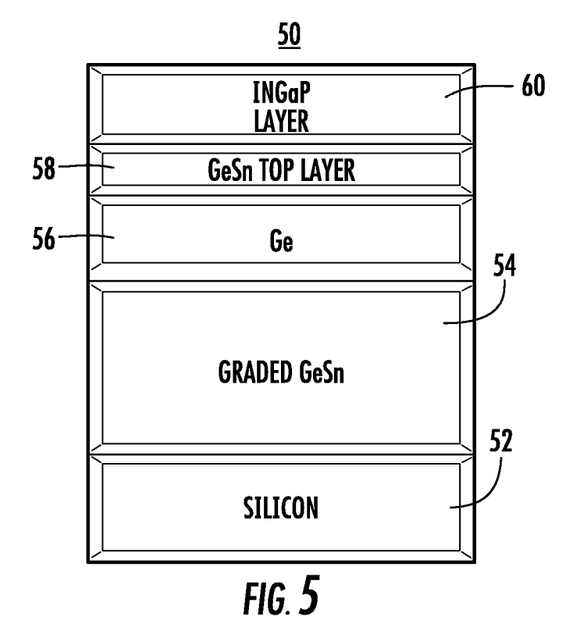
FIG. 5 is a simplified layer diagram of a III-V solar collection material grown on a graded GeSn template on a silicon substrate in accordance with the present invention.
Figure 6:
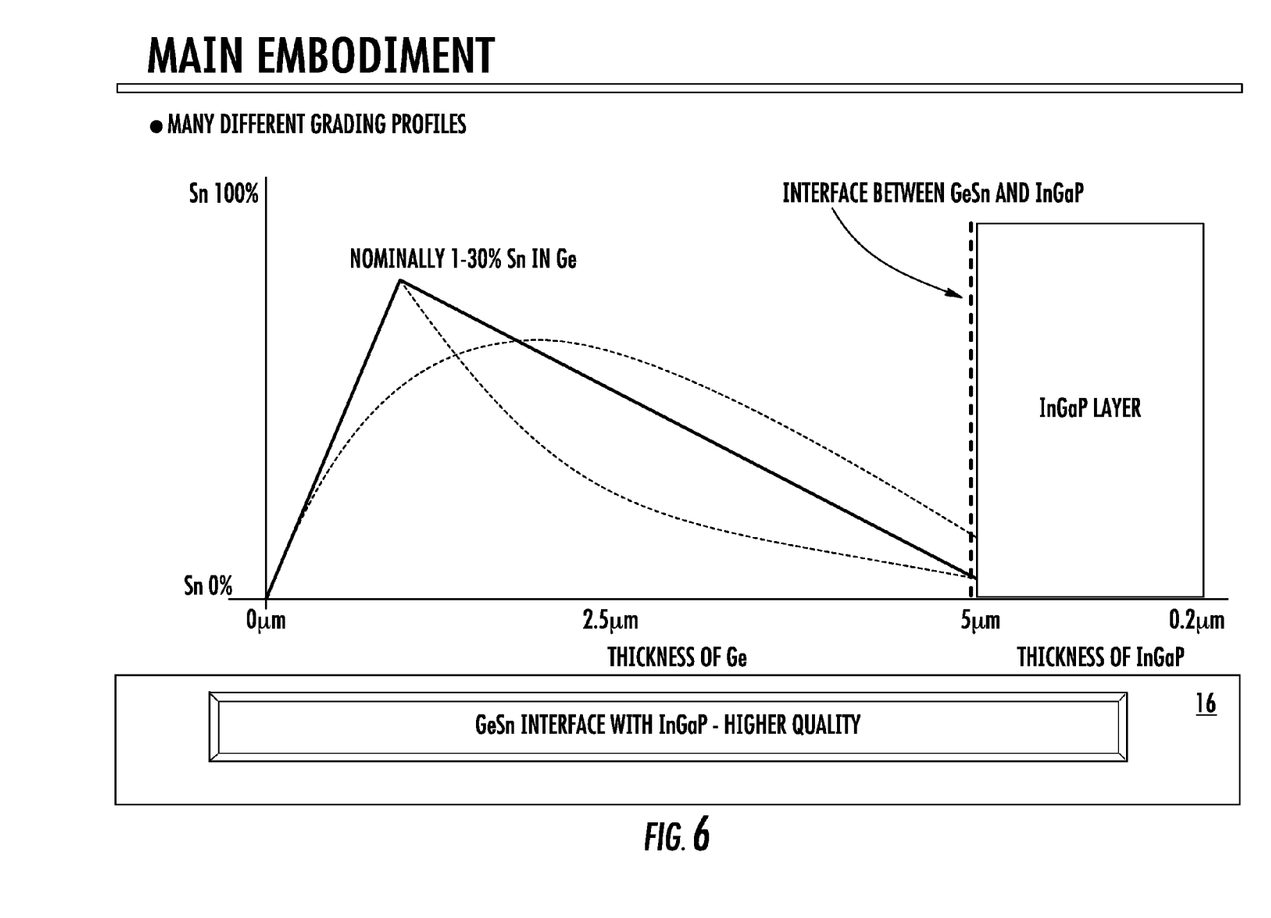
FIGS. 6-10 are graphs illustrating some specific grading profiles for the deposition of a GeSn template in accordance with the present invention.
Figure 7:
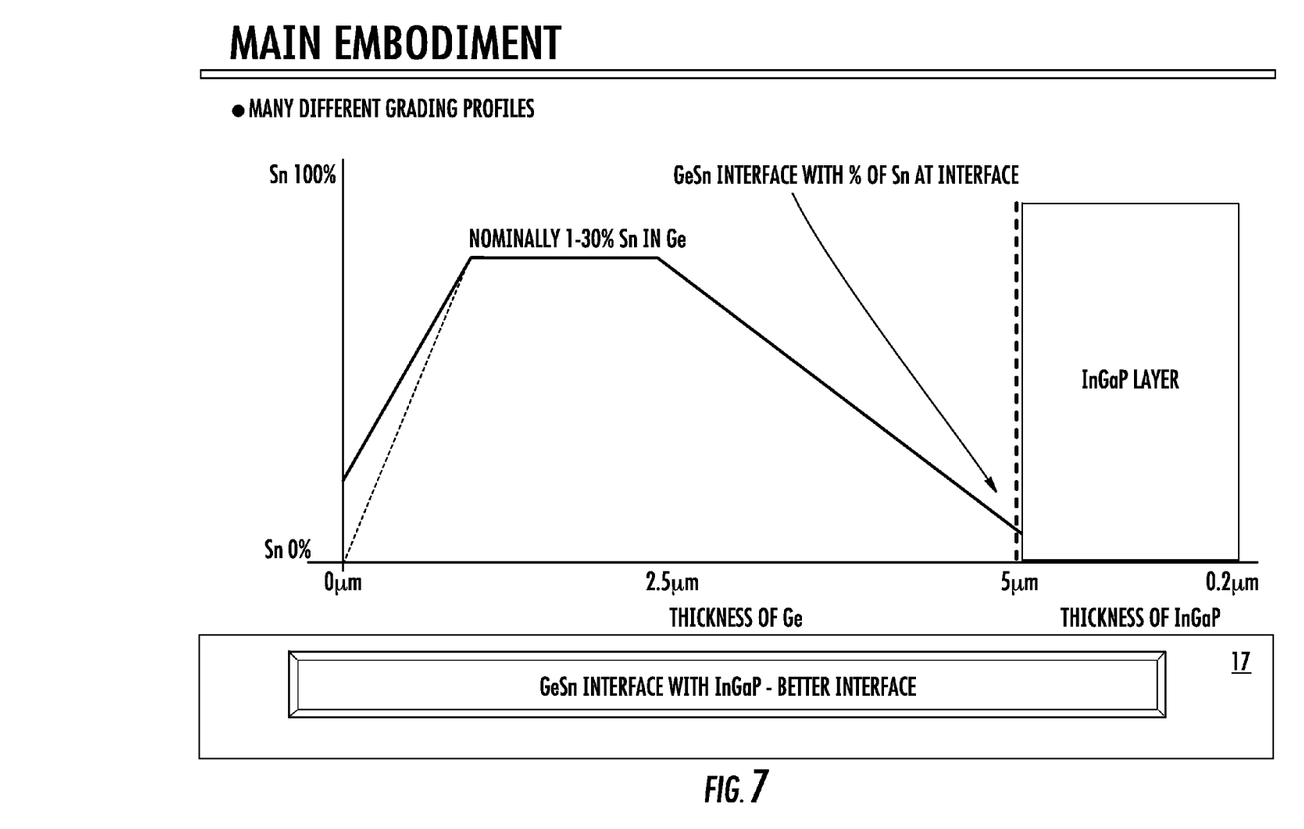
Figure 8:
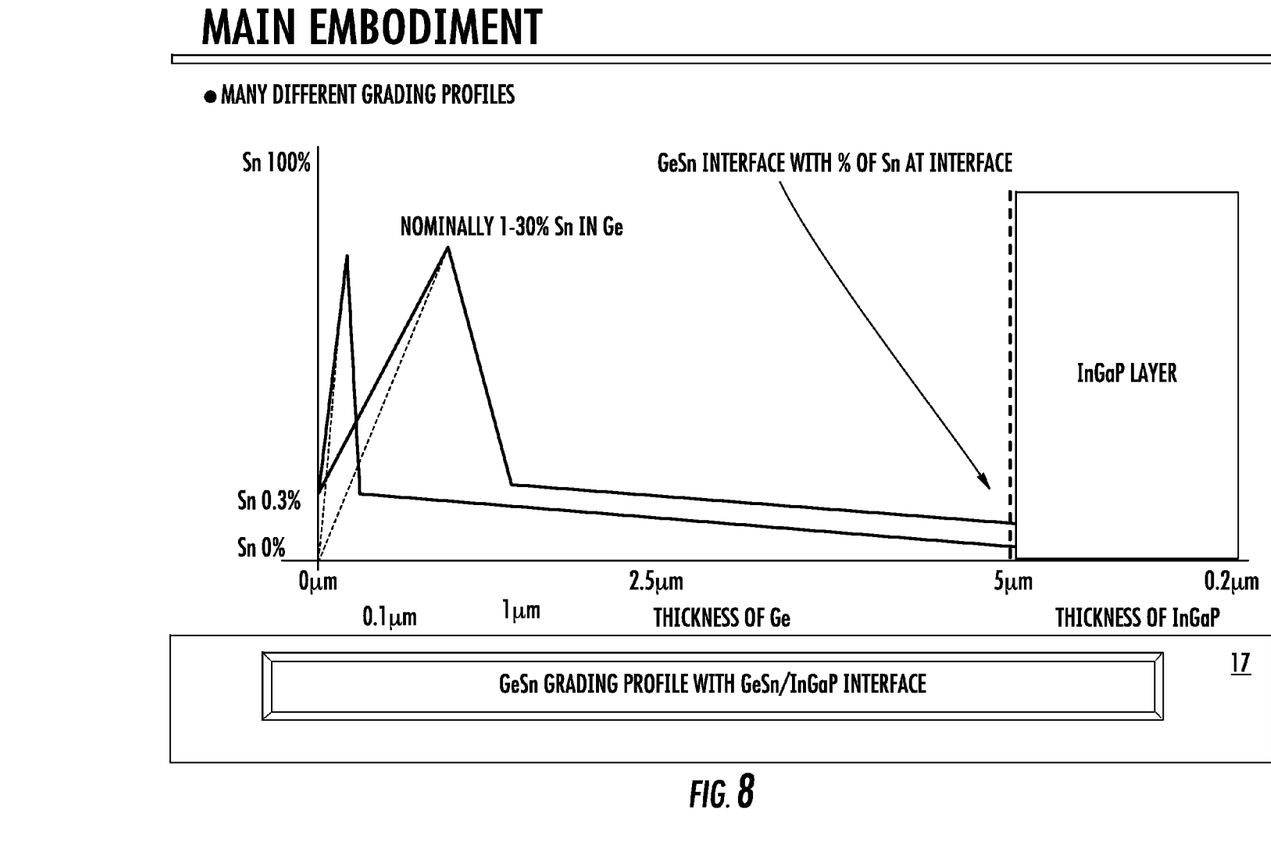
Figure 9:
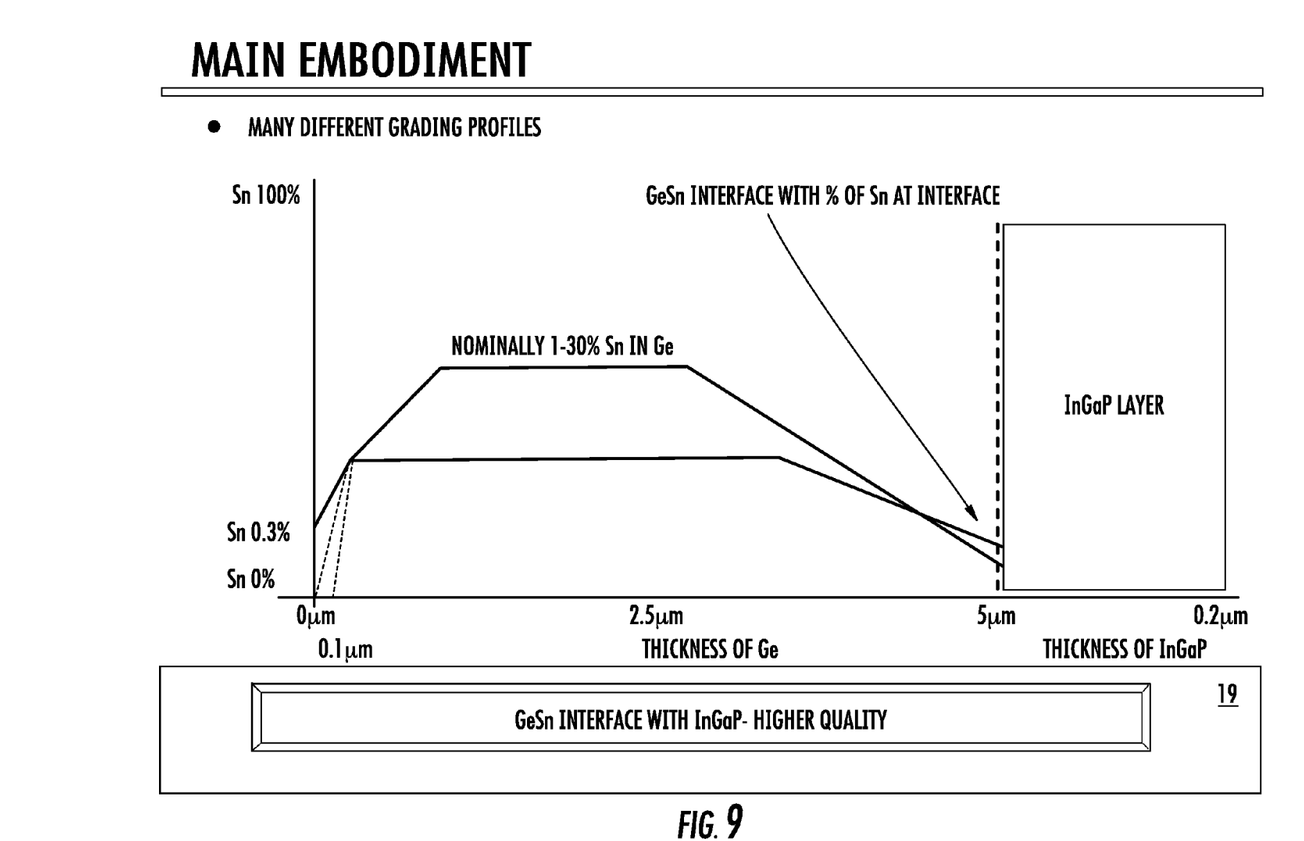
Figure 10:
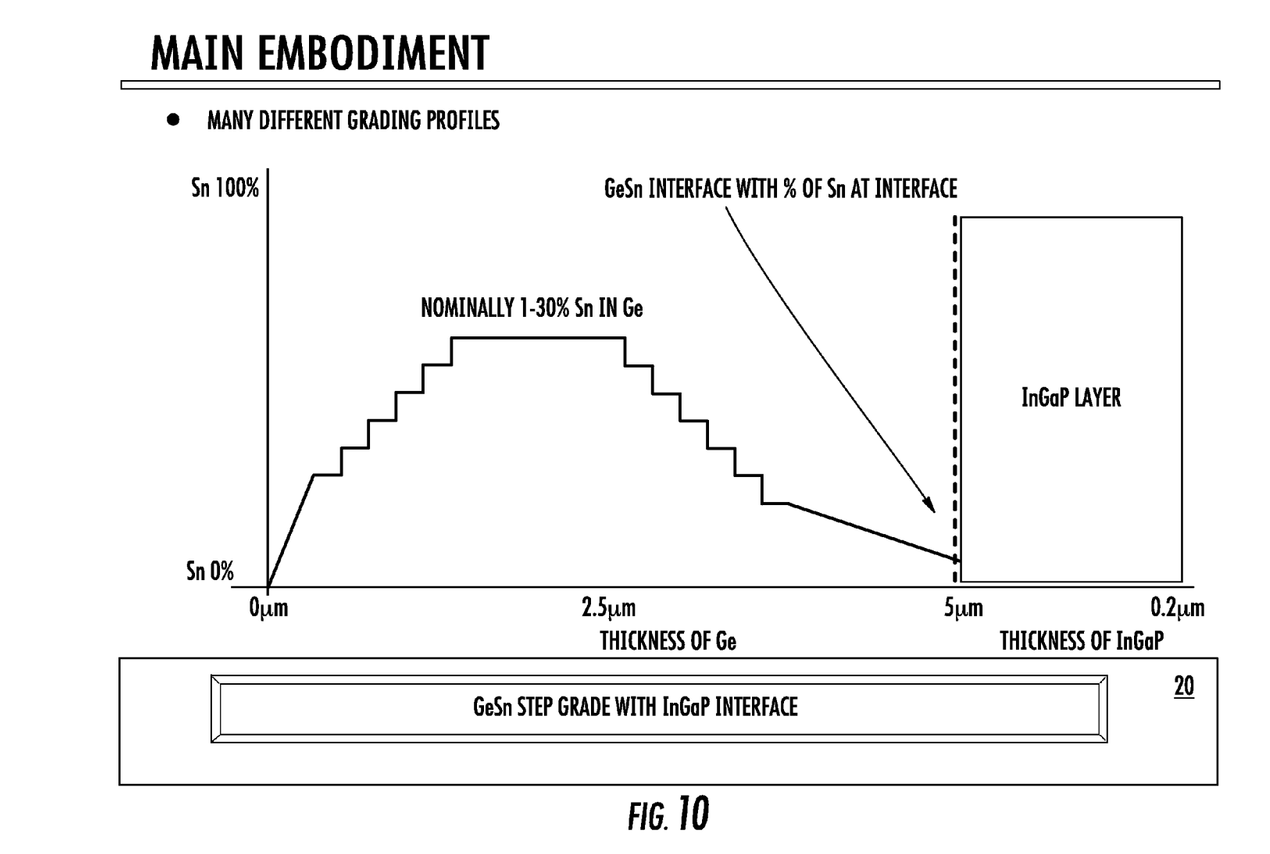

Turning to FIG. 5, another example is illustrated of a solar collector 50 fabricated in accordance with the present invention. Solar collector 50 includes a crystalline silicon substrate or wafer 52 with a layer or template 54 of graded GeSn deposited thereon. Template 54 includes germanium with graded or varying amounts of tin included therein as the layer is deposited. Any of the profiles illustrated in FIGS. 6-10 can be used or any other profile in which the tin is started at zero with the germanium or at some value, such as 0.3%, and the percentage of tin varies throughout the deposition generally reducing or tapering off from a maximum mid-area as the growth progresses. In this specific example a layer 56 of Ge is deposited on the surface of layer 54 and will generally be simply a continuation of the grading process with the amount of Sn set to zero. Also, in this example a layer 58 of GeSn is deposited on layer 56 and may include a fixed amount of Sn, since it is epitaxially grown on the layer of Ge. One or more layers of relatively high band gap material is then grown on layer 58. In this specific example, a layer 60 of InGaP is epitaxially deposited on layer 58.

In the example illustrated in FIG. 5, layer 54 is the GeSn graded layer which serves as a template for the subsequent growth of solar collection materials. Because layer 54 includes graded tin it can be grown 3 μm to 5 μm thick so as to provide a good crystalline quality template for further growth. Also, the epitaxial growth of Ge layer 56 and GeSn layer 58 is simply a continuation of the initial process so that good interfaces are formed between the three layers. Further, GeSn layer 58 includes approximately 2% Sn so as to extend the detection range of the Ge into the IR range of the solar spectrum. The one or more layers of relatively high band gap material, in this specific example layer 60 of InGaP, is epitaxially grown of high crystalline quality III-V material on GeSn layer 58 with a good interface to absorb the higher energy components of the solar spectrum. A high efficiency solar collector is provided that includes III-V semiconductor material epitaxially grown on GeSn and that is epitaxially grown on a silicon substrate. The solar collector includes improved quality crystallinity and improved interfaces between adjacent layers.

Thus new and improved methods have been disclosed for the growth of single crystal III-V solar collection materials on single crystal GeSn on silicon substrates. The new and improved methods of growing III-V solar collection materials on GeSn result in higher crystalline quality for the GeSn material and improved interfaces between adjacent layers. Further, new and improved solar cells are fabricated with increased efficiency that are less costly and easier to produce.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of depositing III-V solar collection materials on a GeSn template on a silicon substrate comprising the steps of:
   providing a crystalline silicon substrate;
   epitaxially growing a graded single crystal GeSn layer on the silicon substrate using a grading profile to grade Sn through the layer, the graded single crystal GeSn layer having a thickness in a range of approximately 3 μm to approximately 5 μm, and
   epitaxially growing a layer of III-V solar collection material on the graded single crystal GeSn layer, the graded single crystal GeSn layer including Sn up to an interface with the layer of III-V solar collection material.

2. A method as claimed in claim 1 wherein the grading profile includes starting the Sn at or near zero with the Ge at zero, varying the percentage of Sn to a maximum mid-area, and reducing the percentage of SN as the growth progresses.

3. A method of fabricating a solar cell on a silicon substrate comprising the steps of:
   providing a crystalline silicon substrate;
   epitaxially growing a graded single crystal GeSn layer on the silicon substrate using a grading profile to grade Sn through the layer, the graded single crystal GeSn layer having a thickness in a range of approximately 3 μm to approximately 5 μm;
   epitaxially growing a single crystal layer of Ge on the graded single crystal GeSn layer;
   epitaxially growing a single crystal layer of GeSn on the single crystal Ge layer; and
   epitaxially growing a layer of single crystal III-V solar collection material on the single crystal layer of GeSn.

4. III-V solar collection material on a GeSn template comprising;
   a crystalline silicon substrate;
   a single crystal graded GeSn layer epitaxially grown on the silicon substrate, the Sn being graded through the layer, and the graded single crystal GeSn layer having a thickness in a range of approximately 3 μm to approximately 5 μm; and
   a layer of III-V solar collection material epitaxially grown on the graded single crystal GeSn layer, the graded single crystal GeSn layer including Sn up to an interface with the layer of III-V solar collection material.

5. III-V solar collection material on a GeSn template as claimed in claim 4 wherein the graded single crystal GeSn layer starts with the Sn at or near zero with the Ge at zero, and the percentage of Sn varies to a maximum mid-area with the percentage of SN reducing as the growth progresses.

6. A solar collection device on a silicon substrate comprising;
   a crystalline silicon substrate;
   a graded single crystal GeSn layer epitaxially grown on the silicon substrate, the Sn being graded through the layer, and the graded single crystal GeSn layer having a thickness in a range of approximately 3 μm to approximately 5 μm;
   a single crystal Ge layer epitaxially grown on the graded single crystal GeSn layer;
   a single crystal GeSn layer epitaxially grown on the single crystal Ge layer; and
   a layer of III-V solar collection material epitaxially grown on the single crystal GeSn layer.

7. A solar collection device on a silicon substrate as claimed in claim 6 wherein the graded single crystal GeSn layer starts with the Sn at or near zero with the Ge at zero, and the percentage of Sn varies to a maximum mid-area with the percentage of SN reducing as the growth progresses.

8. A solar collection device on a silicon substrate as claimed in claim 6 wherein the layer of III-V solar collection material includes InGaP.

* * * * *